US008841146B2

United States Patent
Yen et al.

(10) Patent No.: US 8,841,146 B2
(45) Date of Patent: Sep. 23, 2014

(54) METHOD AND SYSTEM FOR FABRICATING LIGHT EMITTING DIODE (LED) DICE WITH WAVELENGTH CONVERSION LAYERS HAVING CONTROLLED COLOR CHARACTERISTICS

(75) Inventors: Jui-Kang Yen, Zhubei (TW); Georg Soerensen, Chu-Nan (TW); Mark Ewing Tuttle, Zhubei (TW)

(73) Assignee: SemiLEDS Optoelectronics Co., Ltd., Chu-Nan (TW)

( * ) Notice: Subject to any disclaimer, the term of this patent is extended or adjusted under 35 U.S.C. 154(b) by 198 days.

(21) Appl. No.: 13/562,519

(22) Filed: Jul. 31, 2012

(65) Prior Publication Data
US 2013/0065327 A1 Mar. 14, 2013

Related U.S. Application Data

(63) Continuation-in-part of application No. 13/229,824, filed on Sep. 12, 2011.

(51) Int. Cl.
*H01L 21/00* (2006.01)
*H01L 33/00* (2010.01)
*H01L 33/50* (2010.01)

(52) U.S. Cl.
CPC .......... *H01L 33/501* (2013.01); *H01L 33/0095* (2013.01); *H01L 2933/0041* (2013.01)
USPC ............... 438/29; 257/E33.061; 257/E21.528

(58) Field of Classification Search
None
See application file for complete search history.

(56) References Cited

U.S. PATENT DOCUMENTS

| 5,998,925 | A | 12/1999 | Shimizu et al. |
|---|---|---|---|
| 6,351,069 | B1 | 2/2002 | Lowery et al. |
| 6,504,181 | B2 | 1/2003 | Furukawa et al. |
| 6,576,488 | B2 | 6/2003 | Collins, III et al. |
| 6,589,809 | B1 | 7/2003 | Koopmans |
| 6,642,652 | B2 | 11/2003 | Collins, III et al. |
| 6,744,196 | B1 | 6/2004 | Jeon |
| 7,045,956 | B2 | 5/2006 | Braune et al. |
| 7,195,944 | B2 | 3/2007 | Tran et al. |
| 7,361,938 | B2 | 4/2008 | Mueller et al. |

(Continued)

FOREIGN PATENT DOCUMENTS

WO  WO 2004040661  5/2004

OTHER PUBLICATIONS

Edward D. Cohen, "Choosing the Coating Method", Modern Coating and Drying Technology, date unavailable, pp. 1-20.

(Continued)

*Primary Examiner* — Daniel Luke
(74) *Attorney, Agent, or Firm* — Stephen A. Gratton (57) ABSTRACT

A method for fabricating light emitting diode (LED) dice includes the steps of coating a transparent substrate with a wavelength conversion material, continuously evaluating a correlated color temperature (CCT) of the output electromagnetic radiation produced by the wavelength conversion material and comparing the correlated color temperature (CCT) to a target correlated color temperature (CCT), and controlling the coating step responsive to feedback from the evaluating and comparing step to adjust the correlated color temperature (CCT) to achieve the target correlated color temperature (CCT). A system for fabricating light emitting diode (LED) dice includes a coating system, a monitoring system, and a control system configured to control the coating system to adjust the correlated color temperature (CCT) of the wavelength conversion material on the transparent substrate to achieve the target correlated color temperature (CCT).

16 Claims, 6 Drawing Sheets

(56) References Cited

U.S. PATENT DOCUMENTS

| | | |
|---|---|---|
| 7,432,119 B2 | 10/2008 | Doan |
| 7,615,789 B2 | 11/2009 | Tran |
| 7,646,033 B2 | 1/2010 | Tran et al. |
| 7,737,459 B2 | 6/2010 | Edmond et al. |
| 7,781,783 B2 | 8/2010 | Yen et al. |
| 7,824,941 B2 | 11/2010 | Braune et al. |
| 8,012,774 B2 | 9/2011 | Tran et al. |
| 2002/0076904 A1 | 6/2002 | Imler |
| 2002/0089058 A1 | 7/2002 | Hedler et al. |
| 2002/0185965 A1 | 12/2002 | Collins et al. |
| 2004/0077114 A1 | 4/2004 | Coman et al. |
| 2004/0245543 A1 | 12/2004 | Yoo |
| 2005/0173692 A1 | 8/2005 | Park et al. |
| 2006/0003477 A1 | 1/2006 | Braune et al. |
| 2006/0061259 A1 | 3/2006 | Negley |
| 2007/0128745 A1* | 6/2007 | Brukilacchio et al. .......... 438/22 |
| 2007/0267646 A1 | 11/2007 | Wierer, Jr. et al. |
| 2009/0273918 A1 | 11/2009 | Falicoff et al. |
| 2010/0165599 A1 | 7/2010 | Allen |
| 2011/0132521 A1* | 6/2011 | Paolini et al. .................... 156/67 |
| 2011/0203522 A1* | 8/2011 | Xu et al. ....................... 118/665 |
| 2012/0034715 A1* | 2/2012 | Kim ................................ 438/16 |
| 2012/0187427 A1* | 7/2012 | Chandra ......................... 257/88 |
| 2013/0178002 A1* | 7/2013 | LAM et al. ..................... 438/27 |

OTHER PUBLICATIONS

Nitto Denko Revalpha Thermal Release Tape, Semiconductor Equipment Corp., Moorpark, CA, advertising page, available at www.Semicorp.com, date unavailable, one sheet.

U.S. Appl. No. 13/229,824, filed Sep. 12, 2011, titled."Method for Fabricating Light Emitting Diode (LED) Devices Having Output With Selected Characteristics", pp. 1-24.

* cited by examiner

METHOD AND SYSTEM FOR FABRICATING LIGHT EMITTING DIODE (LED) DICE WITH WAVELENGTH CONVERSION LAYERS HAVING CONTROLLED COLOR CHARACTERISTICS

CROSS REFERENCE TO RELATED APPLICATIONS

This application is a continuation-in-part of Ser. No. 13/229,824 filed Sep. 12, 2011, which is incorporated herein by reference.

BACKGROUND

This disclosure relates generally to light emitting diodes (LED) dice having wavelength conversion layers and to a method and system for fabricating light emitting diode (LED) dice with wavelength conversion layers having controlled color characteristics.

Light emitting diode (LED) dice have been developed that produce white light. In order to produce white light, a blue (LED) die can be used in combination with a wavelength conversion layer, such as a phosphor layer formed on the surface of the die. The electromagnetic radiation emitted by the blue (LED) die excites the atoms of the wavelength conversion layer, which converts some of the electromagnetic radiation in the blue wavelength spectral region to the yellow wavelength spectral region. The ratio of the blue to the yellow can be manipulated by the composition and geometry of the wavelength conversion layer, such that the output of the light emitting diode (LED) die appears to be white light.

In this type of light emitting diode (LED) die, the characteristics of the white light are determined by the electromagnetic radiation emitted by the LED die and by the wavelength conversion properties of the wavelength conversion layer. For example, the color characteristics of the white light depends upon the spectral distribution of electromagnetic radiation produced by the wavelength conversion layer. Any variations in the spectral distribution can vary the color characteristics resulting in an undesirable color balance and a faulty color rendition.

It is difficult to fabricate light emitting diode (LED) dice with consistent color balance because any variations in the fabrication process can change the output of the wavelength conversion layers. The present disclosure is directed to a method and system for fabricating light emitting diode (LED) dice with wavelength conversion layers having controlled color characteristics. Using the method and system light emitting diode (LED) dice can be fabricated to produce white light having a desired color temperature, color balance and spectral distribution.

SUMMARY

A method for fabricating light emitting diode (LED) dice includes the steps of preparing a wavelength conversion material in viscous form configured to convert input electromagnetic radiation in a first spectral region to output electromagnetic radiation in a second spectral region, coating a transparent substrate with a wavelength conversion material, continuously evaluating a correlated color temperature (CCT) of the output electromagnetic radiation and comparing the correlated color temperature (CCT) to a target correlated color temperature (CCT), and controlling the coating step responsive to feedback from the evaluating and comparing step to adjust the correlated color temperature (CCT) to achieve the target correlated color temperature (CCT). The method can also include the steps of providing a light emitting diode (LED) die having a desired configuration, forming the wavelength conversion material into a wavelength conversion layer having a desired peripheral shape and features, and attaching the wavelength conversion layer to the light emitting diode (LED) die. The wavelength conversion layer can include the transparent substrate, or alternately the transparent substrate can be separated to provide a substrate free wavelength conversion layer.

A system for fabricating light emitting diode (LED) dice includes a coating system configured to continuously deposit a wavelength conversion material in viscous form on a transparent substrate, an electromagnetic radiation source configured to direct an input electromagnetic radiation in a first spectral region through the transparent substrate and the wavelength conversion material to produce an output electromagnetic radiation in a second spectral region, a monitoring system configured to continuously determine and compare a correlated color temperature (CCT) of the output electromagnetic radiation produced by the wavelength conversion material on the transparent substrate to a target correlated color temperature (CCT), and a control system configured to control the coating system responsive to evaluating the correlated color temperature (CCT) to adjust the correlated color temperature (CCT) of the wavelength conversion material on the transparent substrate to achieve the target correlated color temperature (CCT).

DETAILED DESCRIPTION

It is to be understood that when an element is stated as being "on" another element, it can be directly on the other element or intervening elements can also be present. However, the term "directly" means there are no intervening elements. In addition, although the terms "first", "second" and "third" are used to describe various elements, these elements should not be limited by the term. Also, unless otherwise defined, all terms are intended to have the same meaning as commonly understood by one of ordinary skill in the art.

Figure 1:
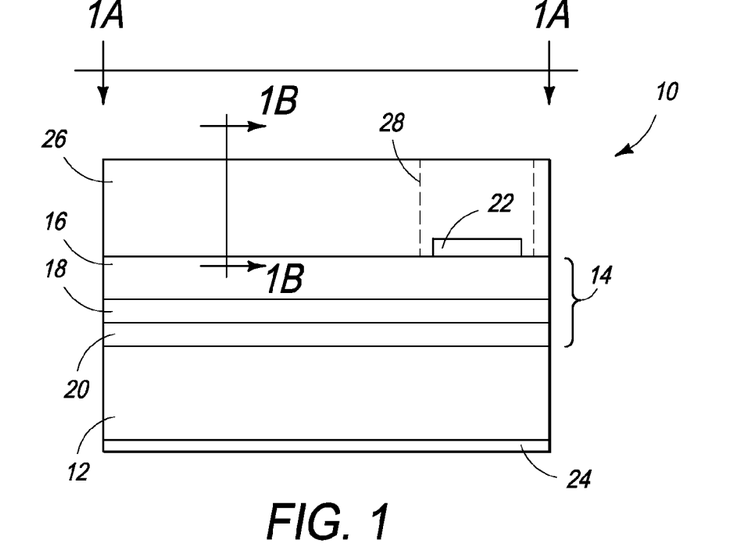
FIG. 1 is a schematic cross sectional view of a vertical light emitting diode (VLED) die having a wavelength conversion layer.

Referring to FIG. 1, a vertical light emitting diode (VLED) die 10 is illustrated. For simplicity various elements of the light emitting diode (LED) die 10 are not illustrated. However, this type of vertical light emitting diode (VLED) die is further described in U.S. Pat. Nos. 7,195,944 and 7,615,789, both of which are incorporated herein by reference. Although the vertical light emitting diode (VLED) die 10 is described, it is to be understood that the concepts described herein can also be applied to other types of light emitting diode (LED) dice such as ones with planar electrode configurations.

The vertical light emitting diode (VLED) die 10 includes a conductive substrate 12, and an epitaxial stack 14 on the conductive substrate 12. The epitaxial stack 14 includes an n-type confinement layer 16, a multiple quantum well (MQW) layer 18 in electrical contact with the n-type confinement layer 16 configured to emit electromagnetic radiation, and a p-type confinement layer 20 in electrical contact with the multiple quantum well (MQW) layer 18.

The n-type confinement layer 16 preferably comprises n-GaN. Other suitable materials for the n-type confinement layer 16 include n-AlGaN, n-InGaN, n-AlInGaN, AlInN and n-AlN. The multiple quantum well (MQW) layer 18 preferably includes one or more quantum wells comprising one or more layers of InGaN/GaN, AlGaInN, AlGaN, AlInN and AlN. The multiple quantum well (MQW) layer 18 can be configured to emit electromagnetic radiation from the visible spectral region (e.g., 400-770 nm), the violet-indigo spectral region (e.g., 400-450 nm), the blue spectral region (e.g., 450-490 nm), the green spectral region (e.g., 490-560 nm), the yellow spectral region (e.g., 560-590 nm), the orange spectral region (e.g., 590-635 nm) or the red spectral region (e.g., 635-700 nm). The p-type confinement layer 20 preferably comprises p-GaN. Other suitable materials for the p-type confinement layer 20 include p-AlGaN, p-InGaN, p-AlInGaN, p-AlInN and p-AlN.

Still referring to FIG. 1, the vertical light emitting diode (VLED) die 10 also includes an n-electrode 22 on the n-type confinement layer 16 and a p-electrode 24 on the backside of the conductive substrate 12. The n-electrode 22 and the p-electrode 24 can comprise a conductive material, such as a single layer of a metal such as W, Ti, Mo, Al, Cu, Ni, Ag, Au or Co, a metal alloy such as Cu—Co or Cu—Mo, or a metal stack such as Ni/Cu or Ni/Cu—Mo.

The vertical light emitting diode (VLED) die 10 also includes a wavelength conversion layer 26 formed on the epitaxial stack 14 in contact with the n-type confinement layer 16. The wavelength conversion layer 26 includes an opening 28 aligned with the n-electrode 22 for providing access to the n-electrode 22. The wavelength conversion layer 26 is configured to convert at least some of the electromagnetic radiation emitted by the multiple quantum well (MQW) layer 18 into electromagnetic radiation having a different wavelength range, such as a higher wavelength range. For example, if the multiple quantum well (MQW) layer 18 emits electromagnetic radiation in a blue spectral range, the wavelength conversion layer 26 can be configured to convert at least some of this radiation to a yellow spectral range, such that the output of the vertical light emitting diode (VLED) die 10 appears to be white light.

Figure 1A:
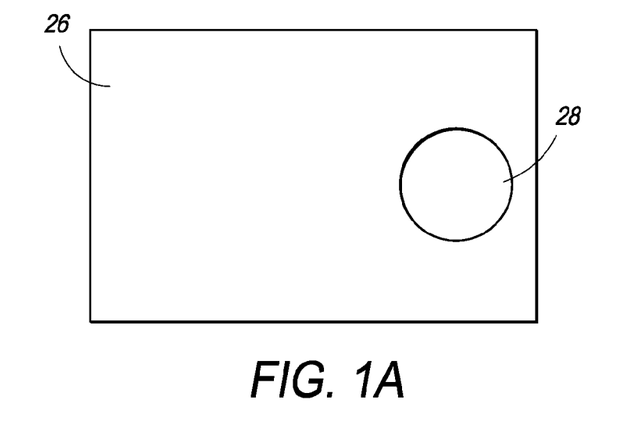
FIG. 1A is a schematic plan view taken along line 1A-1A of FIG. 1 illustrating the wavelength conversion layer on the vertical light emitting diode (VLED) die.
Figure 1B:
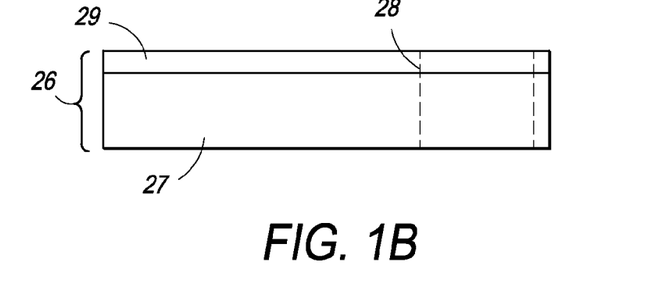
FIG. 1B is a schematic cross sectional view taken along line 1B-1B of FIG. 1 illustrating the wavelength conversion layer on the vertical light emitting diode (VLED) die.

As shown in FIG. 1A, the wavelength conversion layer 26 can have a peripheral shape that substantially matches the peripheral shape of the vertical light emitting diode (VLED) die 10. As shown in FIG. 1B, the wavelength conversion layer 26 can include a transparent substrate 27 and a wavelength conversion material 29 formed on the transparent substrate 27.

Figure 1C:
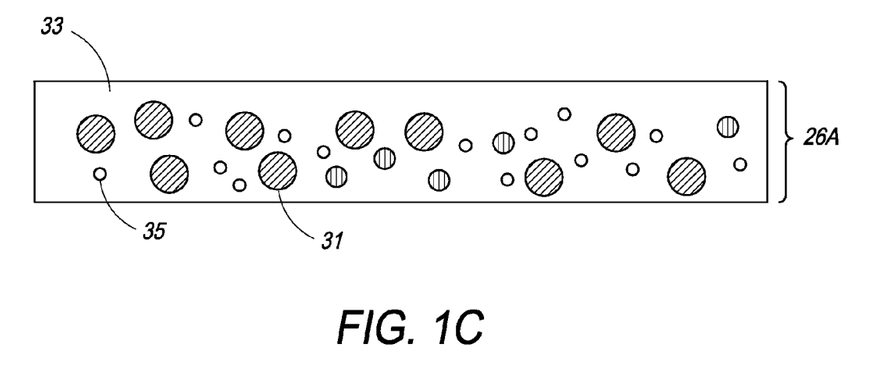
FIG. 1C is a schematic cross sectional view equivalent to FIG. 1B illustrating an alternate embodiment wavelength conversion layer having wavelength conversion particles.

Alternately, as shown in FIG. 1C, an alternate embodiment wavelength conversion layer 26A can include wavelength conversion particles 31 embedded in a base material 33. The base material 33 can comprise a transparent base material such as a polymer, a glass, or a ceramic containing the wavelength conversion particles 31. Suitable materials for the wavelength conversion particles 31 include phosphor compounds such as YAG:Ce, TAG:Ce, alkaline earth silicon nitride doped with Eu, alkaline earth silicate doped with Eu, and calcium scandate doped with Ce. The wavelength conversion layer 26A can also include reflective particles 35 embedded in the base material 33. Suitable materials for the reflective particles 35 include $TiO_2$, $Al_2O3$ and $SiO_2$. In addition, the wavelength conversion particles 31 and the reflective particles 35 can have a diameter of from about 8 µm to 40 µm and a weight percentage in the base material 33 of from 10 wt % to 85 wt %.

Figure 1D:
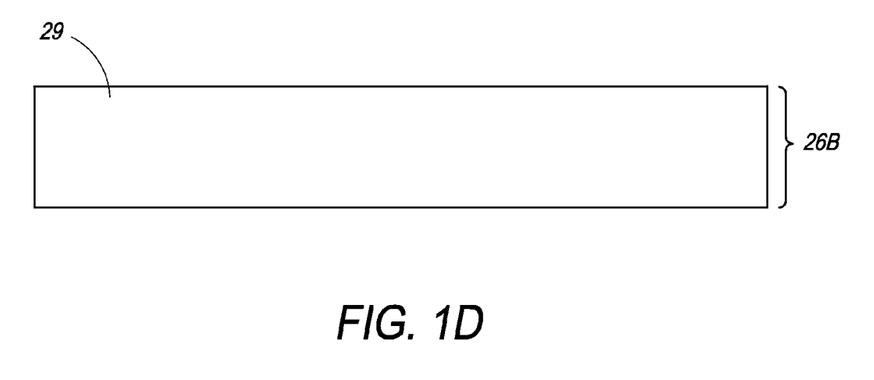
FIG. 1D is a schematic cross sectional view equivalent to FIG. 1B illustrating an alternate embodiment substrate free wavelength conversion layer.

Alternately, as shown in FIG. 1D, an alternate embodiment substrate free wavelength conversion layer 26B can include the wavelength conversion material 29 but without the transparent substrate 27. The substrate free wavelength conversion layer 26B can be made by peeling the transparent substrate 27 away from the wavelength conversion material 29 or by direct extrusion.

Figure 2:
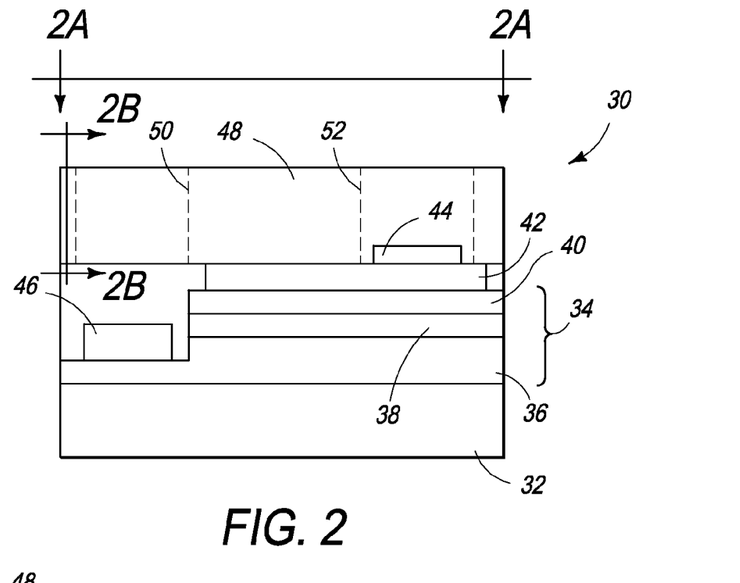
FIG. 2 is a schematic cross sectional view of a planar light emitting diode (PLED) die having a wavelength conversion layer.

Referring to FIG. 2, a planar light emitting diode (PLED) die 30 is illustrated. The planar light emitting diode (PLED) die 30 includes an LED substrate 32, and an epitaxial stack 34 on the LED substrate 32. The epitaxial stack 34 includes an n-type confinement layer 36, a multiple quantum well (MQW) layer 38 in electrical contact with the n-type confinement layer 36 configured to emit electromagnetic radiation, and a p-type confinement layer 40 in electrical contact with the multiple quantum well (MQW) layer 38. The planar light emitting diode (PLED) die 30 also includes a transparent conductive layer 42 and a p-electrode 44 on the p-type confinement layer 40. The planar light emitting diode (PLED) die 30 also includes an n-electrode 46 on the n-type confinement layer 36. The planar light emitting diode (PLED) die 30 also includes a wavelength conversion layer 48 having a first opening 50 aligned with the n-electrode 46 and a second opening 52 aligned with the p-electrode 44. The wavelength conversion layer 48 can be configured substantially as previously described for wavelength conversion layer 26 (FIG. 1).

Figure 2A:
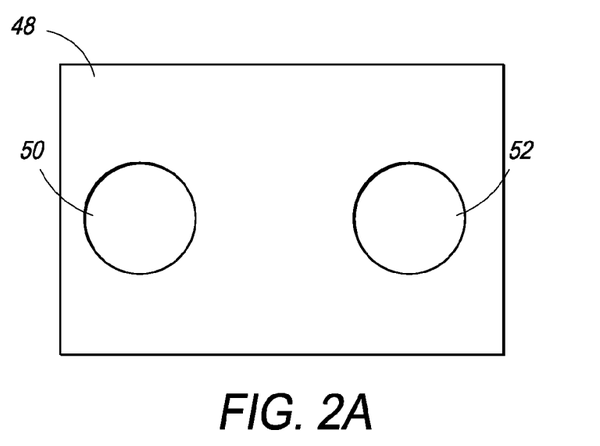
FIG. 2A is a schematic plan view taken along line 2A-2A of FIG. 2 illustrating the wavelength conversion layer on the planar light emitting diode (PLED) die.
Figure 2B:
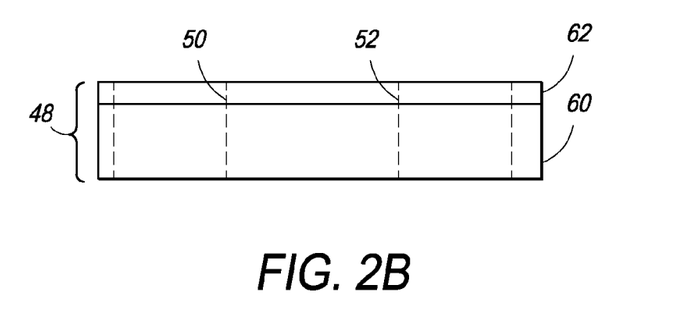
FIG. 2B is a schematic cross sectional view taken along line 2B-2B of FIG. 2 illustrating the wavelength conversion layer on the planar light emitting diode (PLED) die.

As shown in FIG. 2A, the wavelength conversion layer 48 has a peripheral shape that substantially matches the peripheral shape of the planar light emitting diode (PLED) die 30. As shown in FIG. 2B, the wavelength conversion layer 48 includes a transparent substrate 60 and a wavelength conversion material 62 formed on the transparent substrate 60. Alternately, the wavelength conversion layer 48 can include wavelength conversion particles 31 and reflective particles 35 for fabricating wavelength conversion layer 26A (FIG. 1C). As another alternative, the wavelength conversion layer 48 can be separated from the transparent substrate 60 to provide the substrate free wavelength conversion layer 26B (FIG. 1D).

Figure 3A:
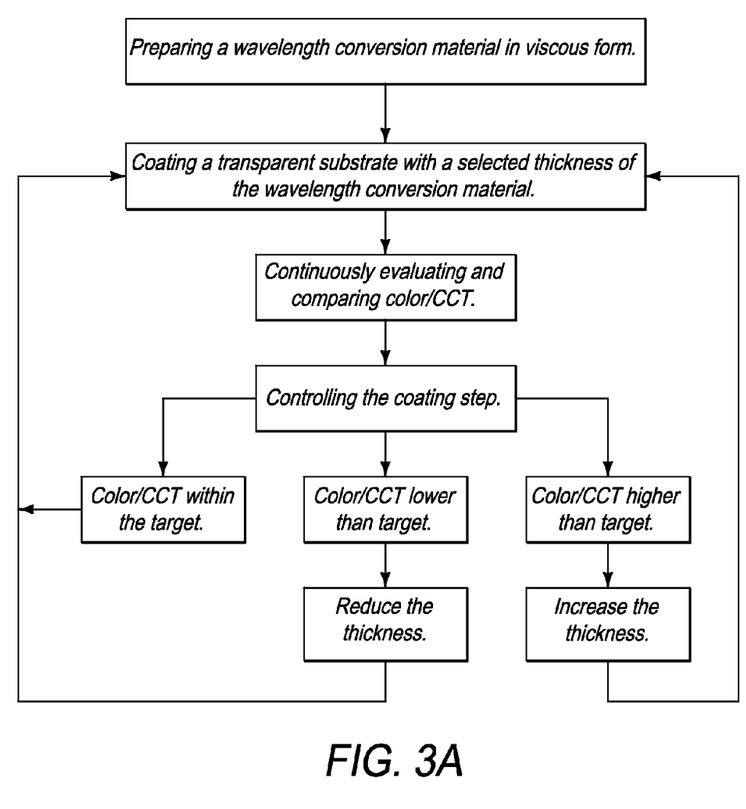
FIG. 3A is a flow diagram of a method for fabricating light emitting diode (LED) dice with wavelength conversion layers.

Referring to FIG. 3A, steps in a method for fabricating light emitting diode (LED) dice with wavelength conversion layers are illustrated in a flow diagram. By way of example, the method can be used to fabricate the vertical light emitting diode (VLED) 10 (FIG. 1) having the wavelength conversion layer 26 (FIG. 1), the wavelength conversion layer 26A (FIG. 1C) or the wavelength conversions layer 26B (FIG. 1D). Similarly, the method can be used to fabricate the planar light emitting diode (PLED) die 30 (FIG. 2) having the wavelength conversion layer 48 (FIG. 2), and to fabricate other types of light emitting diode (LED) dice as well.

As shown in FIG. 3A, the method includes the step of preparing a wavelength conversion material in viscous form. The wavelength conversion material is configured to convert an input electromagnetic radiation in a first spectral region, such as UVA, UVB or UVC, to an output electromagnetic radiation in a second spectral region, such as a higher wavelength spectral region. For example, if the multiple quantum well (MQW) layer 18 emits electromagnetic radiation in a blue spectral region, the wavelength conversion material can include a wavelength conversion compound, such as a phosphor compound, configured to convert at least some of the radiation in the blue spectral region to the yellow spectral region.

The wavelength conversion material can comprise a transparent base material such as a polymer, a glass, or a ceramic containing a wavelength conversion compound, such as a phosphor compound. In addition, the wavelength conversion compound can be incorporated into the base material, using a mixing process to form a viscous mixture. Exemplary base materials for the wavelength conversion material include silicone, epoxy, spin on glass (SOG), $SiO_2$, and $Al_2O_3$ in liquid or viscous form, which can be mixed with the wavelength conversion compound in a specific ratio. Exemplary wavelength conversion compounds for the wavelength conversion material include YAG:Ce, TAG:Ce, alkaline earth silicon nitride doped with Eu, alkaline earth silicate doped with Eu, or calcium scandate doped with Ce. Other suitable wavelength conversion materials are further described in the previously cited U.S. Pat. Nos. 7,195,944 and 7,615,789. For forming the wavelength conversion layer 26A (FIG. 1C), the wavelength conversion material can be in the form of wavelength conversion particles 31 (FIG. 1C) and reflective particles 35 (FIG. 1C).

As shown in FIG. 3A, the method also includes the step of coating a transparent substrate with a selected thickness of the wavelength conversion material. The transparent substrate can comprise a polymer tape or film, such as polyethylene, polypropylene, polyester, or polycarbonate initially contained on a roll or web of material. Suitable tapes are manufactured by Nitto Denko of Japan, and are available in the United States through Semiconductor Equipment Corporation of Moorpark, Calif. 93020. The coating step can be performed using a suitable coating process such as spray coating, die coating, blade coating, knife coating, air knife coating, Gravure coating, roll coating or extrusion coating. Further, the wavelength conversion material can comprise a single layer or multiple layers formed on the transparent substrate using multiple coating processes. Exemplary coating processes are further described in Chapter 1 (pages 1-20) of Modern Coating And Drying Technology, by Edward D. Cohen, entitled "Choosing The Coating Method", which is incorporated herein by reference.

As shown in FIG. 3A, the method also includes the step of continuously evaluating a correlated color temperature (CCT) of the output electromagnetic radiation produced by the wavelength conversion material on the transparent substrate during the depositing step, and comparing the correlated color temperature (CCT) to a target electromagnetic radiation output, such as white light having a particular color temperature. During this step, "correlated color temperature (CCT)" refers to the color appearance of the electromagnetic radiation produced by the wavelength conversion material. This correlated color temperature (CCT) relates the color of this electromagnetic radiation to a reference source when heated to a particular temperature measured in degrees Kelvin (K), providing a "warmth" or "cool" measure of its appearance. For example, color temperatures over 5,000 K are called cool colors (blueish white), while lower color temperatures (2,700-3,000 K) are called warm colors (yellowish white through red).

The evaluating and comparing step can be performed by directing the electromagnetic radiation output from a light source through the wavelength conversion material on the transparent substrate to produce an electromagnetic radiation output, which is then directed into a detector. For example, the light source can be configured to emit electromagnetic radiation in the UVA, UVB or UVC spectrum. The detector can comprise a spectrometer configured to detect the spectrum of the electromagnetic radiation output and convert it into color data (e.g., CIE(x . . . y) or CIE(u', v')). Suitable detectors are commercially available from Instrument Systems (CAS 140B), Ocean Optics (USB 2000) and Wei-Min Industrial (LED-638HC). During the evaluating step, the electromagnetic radiation output from the light source can have an optimal wavelength range, which in theory is approximately equal to the wavelength range for the electromagnetic radiation output of the multiple quantum well (MQW) layer 18 (FIG. 1).

As shown in FIG. 3A, the method also includes the step of controlling the coating step responsive to feedback from the evaluating and comparing step to adjust the correlated color temperature (CCT) to achieve the target temperature color temperature (CCT). One method for performing the controlling step is to control the thickness of the wavelength conversion material on the transparent base. One method for controlling the thickness is by reducing or increasing the flow rate of the wavelength conversion material being deposited on the transparent substrate during the coating step. For example, with the coating step performed by a deposition apparatus such as a spray coater or slot coater the volumetric flow rate of the material being deposited can be adjusted as required to achieve a desired thickness. Another method for controlling the thickness is by reducing or increasing the speed by which the substrate is moved past the deposition apparatus during the coating step. Yet another method for controlling the thickness is by controlling the extrusion of the wavelength conversion material using an extruder.

As shown by the lowest left-hand box in FIG. 3A, with the correlated color temperature (CCT) within the target correlated color temperature (CCT), the coating step does not need to be adjusted. As shown by the lowest center box in FIG. 3A, with the correlated color temperature (CCT) lower than the target correlated color temperature (CCT), the coating step can be adjusted to decrease the thickness of the wavelength conversion material on the transparent substrate. As shown by the lowest right-hand box in FIG. 3A, with the correlated color temperature (CCT) higher than the target correlated color temperature (CCT), the coating step can be adjusted to increase the thickness of the wavelength conversion material on the transparent substrate. The controlling step can be performed using a suitable system such as a computer, a controller or an application specific integrated circuit (ASIC) configured to analyze feedback from the evaluating step and to control deposition of the wavelength conversion material as a function of the feedback.

Figure 3B:
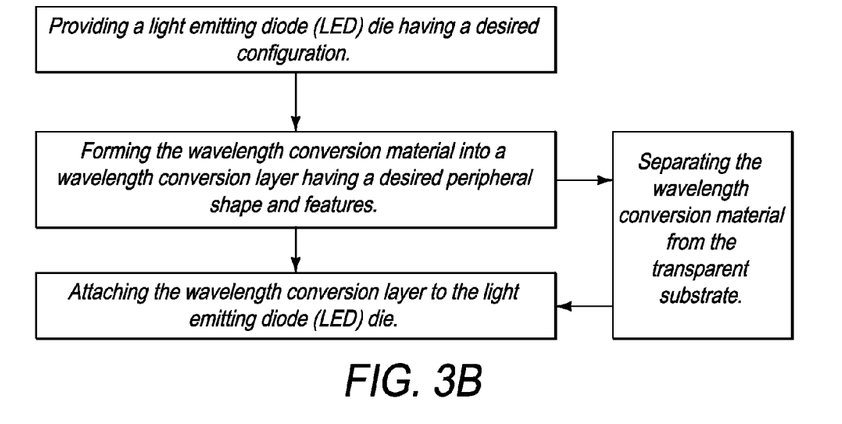
FIG. 3B is a flow diagram illustrating additional steps in the method of FIG. 3A.

As shown in FIG. 3B, the method can also include the step of providing a light emitting diode (LED) die having a desired configuration. For example, the light emitting diode (LED) die can comprise the vertical light emitting diode (VLED) die 10 (FIG. 1) or the planar light emitting diode (PLED) die 30 (FIG. 2). Preferably the light emitting diode (LED) die is contained on a wafer comprising a plurality of dice, such that a wafer level process can be performed for forming the wavelength conversion layer 26 (FIG. 1) or 48 (FIG. 2).

As also shown in FIG. 3B, the method can also include the step of forming the wavelength conversion material into a wavelength conversion layer having a desired peripheral shape and features. The wavelength conversion layer formed in this step will subsequently form the wavelength conversion layer 26 (FIG. 1B), or the wavelength conversion layer 26A (FIG. 1C), or the wavelength conversion layer 26B (FIG. 1D, or the wavelength conversion layer 48 (FIG. 2B). This step can be performed using a suitable curing process such as heat or UV curing system configured to cure the viscous or semi-viscous wavelength conversion material into a solid wavelength conversion layer. The curing process can be followed by a shaping process such as a cutting, stamping or water jetting process performed on the transparent substrate coated with the wavelength conversion material to form the wavelength conversion layers with a desired peripheral shape. In addition, the shaping process can be performed to form required features such as the opening 28 (FIG. 1A) on the wavelength conversion layer 26 (FIG. 1A), or the openings 50, 52 (FIG. 2A) on the wavelength conversion layer 48 (FIG. 2A). For forming the substrate free wavelength conversion layer 26B (FIG. 1D), this step can also include the step of separating the wavelength conversion material from the transparent substrate. This step can be performed by applying a release film to the transparent substrate prior to the coating step and then following curing, peeling the transparent substrate from the wavelength conversion material.

As also shown in FIG. 3B, the method can also include the step of attaching the wavelength conversion layer to the light emitting diode (LED) die. The attachment step can be performed using an attachment system having a capillary device configured to pick and place the wavelength conversion layer formed in the previous step on the vertical light emitting diode (VLED) die 10 (FIG. 1) to form the wavelength conversion layer 26 (FIG. 1B) or the wavelength conversion layer 26A (FIG. 1C) or the wavelength conversion layer 26B (FIG. 1D), or on the planar light emitting diode (PLED) die 30 (FIG. 2) to form the wavelength conversion layer 48 (FIG. 2A). An adhesive polymer such as a silicone or epoxy adhesive deposited on the light emitting diode (LED) die can also be used to perform the attaching step. Alternately, in place of an adhesive layer, the transparent substrate 27 (FIG. 1B) or 60 (FIG. 2B) can include an adhesive surface for attaching the wavelength conversion layer to the light emitting diode (LED) die.

Figure 4:
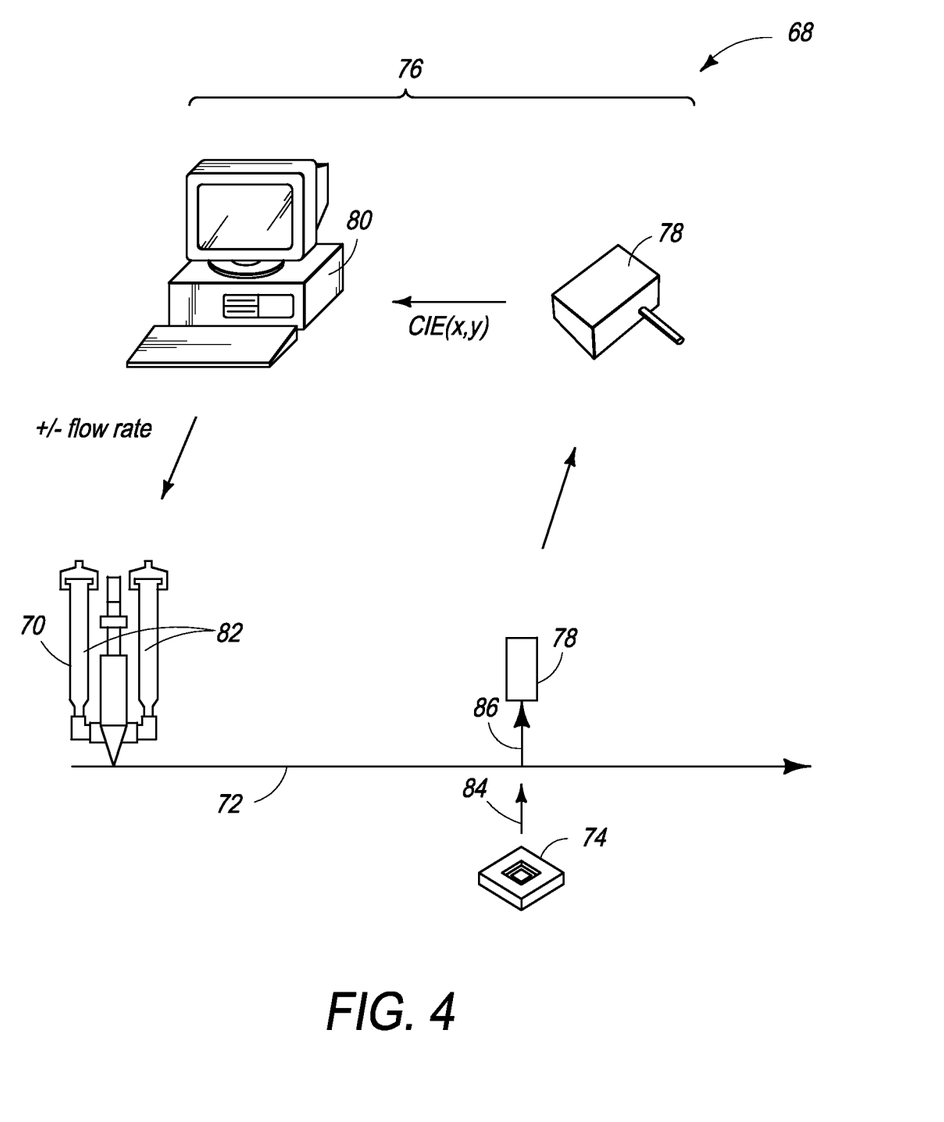
FIG. 4 is a schematic view of a system for fabricating light emitting diode (LED) dice with wavelength conversion layers.

Referring to FIG. 4, a system 68 for fabricating light emitting diode (LED) dice includes a coating system comprising a dispensing apparatus in the form of a spray coater 70 configured to continuously deposit a wavelength conversion material 82 in viscous form on a transparent substrate 72. The spray coater 70 is configured to precisely deposit a selected volumetric flow rate of the wavelength conversion material 82 in viscous form on the transparent substrate 72. The system 68 also includes an electromagnetic radiation source 74 configured to direct an input electromagnetic radiation 84 in a first spectral region through the transparent substrate 72 and the wavelength conversion material 82 on the transparent substrate 72 to produce an output electromagnetic radiation 86 in a second spectral region. The system 68 also includes a monitoring system in the form of a spectrometer 78 configured to continuously determine and compare a correlated color temperature (CCT) of the output electromagnetic radiation 86 produced by the wavelength conversion material 82 on the transparent substrate 72 to a target correlated color temperature (CCT). The system 68 also includes a control system 76 comprising a computer 80 configured to control the spray coater 70 responsive to feedback from the spectrometer 78 on the correlated color temperature (CCT). This feedback allows the thickness of the wavelength conversion material 82 being deposited on the transparent substrate 72 to be continuously adjusted as required to achieve the target correlated color temperature (CCT).

Figure 5:
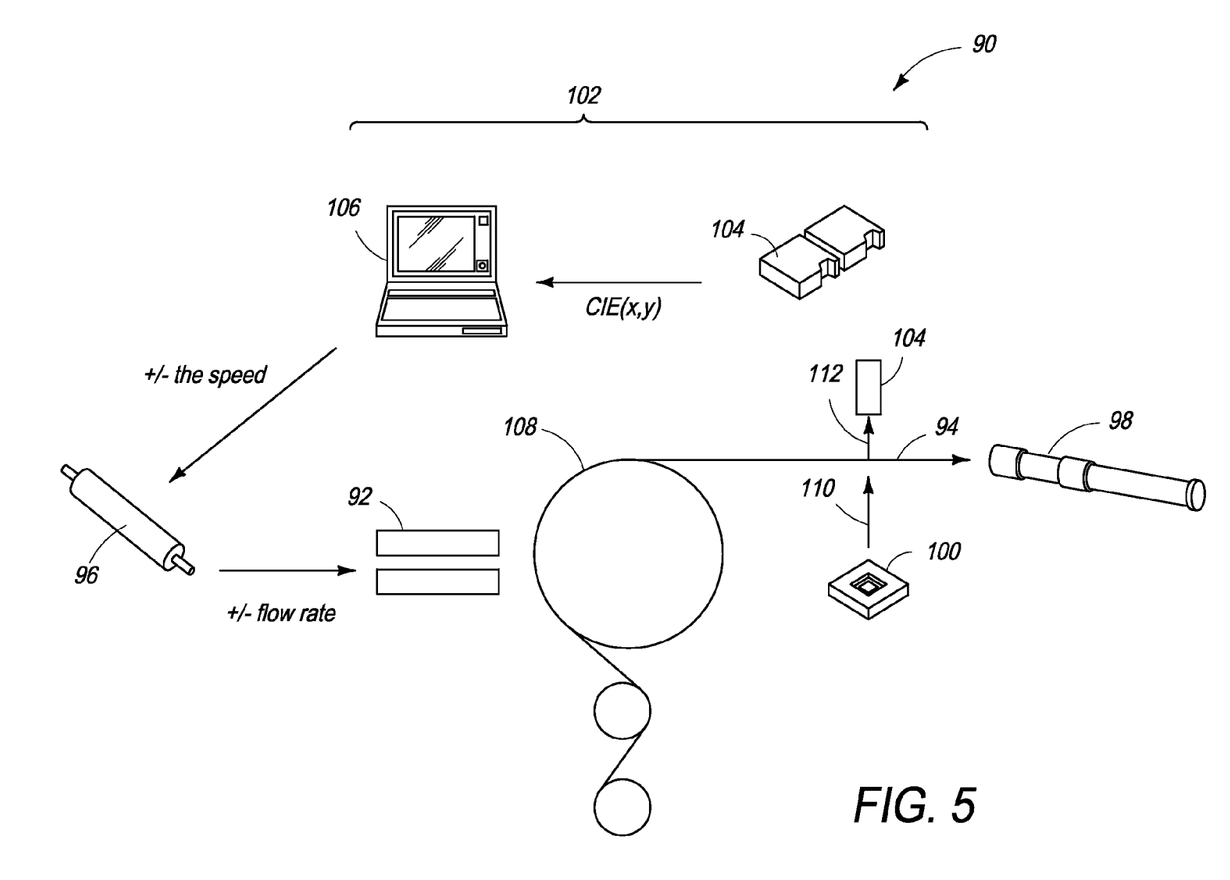
FIG. 5 is a schematic view of an alternate system for fabricating light emitting diode (LED) dice with wavelength conversion layers

Referring to FIG. 5, an alternate system 90 for fabricating light emitting diode (LED) dice includes a coating system comprising a dispensing apparatus in the form of a slot die coater 92 configured to continuously deposit a wavelength conversion material 108 in viscous form on a transparent substrate 94. The slot die coater 92 includes a first actuator 96 configured to control the slot die coater 92 to precisely control the thickness of the wavelength conversion material 108 being deposited on the transparent substrate 94. The first actuator 96 can comprise a suitable mechanism such as a linear actuator or a motor controlled linear stage. In addition, the transparent substrate 94 is contained on a roll or web of material that is moved past the slot die coater 92 by a second actuator 98 with a selected speed. The speed by which the transparent substrate 94 is moved can be precisely controlled to further control the thickness of the wavelength conversion material 108 being deposited on the transparent substrate 94. The second actuator 98 can comprise a suitable mechanism such as a linear actuator or a motor controlled linear stage.

Still referring to FIG. 5, the system 90 also includes an electromagnetic radiation source 100 configured to direct an input electromagnetic radiation 110 in a first spectral region through the transparent substrate 94 and the wavelength conversion material 108 on the transparent substrate 94 to produce an output electromagnetic radiation 112 in a second spectral region. The system 90 also includes a monitoring system in the form of a spectrometer 104 configured to continuously determine and compare a correlated color temperature (CCT) of the output electromagnetic radiation 112 produced by the wavelength conversion material 108 on the transparent substrate 94 to a target correlated color temperature (CCT). The system 90 also includes a control system 102 comprising a computer 106 configured to control the slot die coater 92, the first linear actuator 96 and the second linear actuator 98 responsive to feedback from the spectrometer 78 on the correlated color temperature (CCT). This feedback allows the correlated color temperature (CCT) of the wavelength conversion material 108 on the transparent substrate 94 to be continuously adjusted as required to achieve the target correlated color temperature (CCT).

Thus the disclosure describes an improved system and method for fabricating light emitting diode (LED) dice with wavelength conversion layers having controlled color characteristics. While a number of exemplary aspects and embodiments have been discussed above, those of skill in the art will recognize certain modifications, permutations, additions and subcombinations thereof. It is therefore intended that the following appended claims and claims hereafter introduced are interpreted to include all such modifications, permutations, additions and sub-combinations as are within their true spirit and scope.

What is claimed is:

1. A method for fabricating light emitting diode (LED) dice comprising:

preparing a wavelength conversion material in viscous form configured to convert input electromagnetic radiation in a first spectral region to output electromagnetic radiation in a second spectral region;

coating a transparent substrate with the wavelength conversion material;

continuously evaluating a correlated color temperature (CCT) of the output electromagnetic radiation and comparing the correlated color temperature (CCT) to a target correlated color temperature (CCT);

controlling the coating step responsive to feedback from the evaluating and comparing step to adjust the correlated color temperature (CCT) to achieve the target correlated color temperature (CCT);

forming the wavelength conversion material into a wavelength conversion layer having a desired peripheral shape; and attaching the wavelength conversion layer to a light emitting diode (LED) die.

2. The method of claim 1 wherein the forming the wavelength conversion material step comprises separating the transparent substrate from the wavelength conversion material.

3. The method of claim 1 wherein the evaluating step is performed using an electromagnetic radiation source configured to direct electromagnetic radiation in a selected spectral region through the transparent substrate and through the wavelength conversion material on the transparent substrate into a detector.

4. The method of claim 1 further comprising forming at least one feature on the wavelength conversion layer prior to the attaching step.

5. The method of claim 1 wherein the coating step is performed using a process selected from the group consisting of spray coating, die coating, blade coating, knife coating, air knife coating, Gravure coating, roll coating and extrusion coating.

6. The method of claim 1 wherein the coating step is performed using a dispensing apparatus configured to deposit a selected thickness of the wavelength conversion material on the transparent substrate and the controlling step controls a volumetric flow rate of the wavelength conversion material being deposited.

7. The method of claim 1 wherein the coating step is performed using a dispensing apparatus configured to deposit a selected thickness of the wavelength conversion material on the transparent substrate and the controlling step controls a speed by which the transparent substrate is moved past the deposition apparatus.

8. The method of claim 1 wherein the light emitting diode (LED) die comprises a vertical light emitting diode (VLED) die or a planar light emitting diode (PLED) die.

9. The method of claim 1 wherein the transparent substrate comprises a polymer tape or film initially contained on a roll or web of material.

10. The method of claim 1 wherein the wavelength conversion material comprises a plurality of wavelength conversion particles.

11. A method for fabricating light emitting diode (LED) dice comprising:

preparing a wavelength conversion material in viscous form configured to convert input electromagnetic radiation in a first spectral region to output electromagnetic radiation in a second spectral region;

coating a transparent substrate with the wavelength conversion material by depositing a selected thickness of the wavelength conversion material on the transparent substrate;

continuously evaluating a correlated color temperature (CCT) of the output electromagnetic radiation and comparing the correlated color temperature (CCT) to a target correlated color temperature (CCT);

controlling the coating step responsive to the evaluating and comparing step to adjust the correlated color temperature (CCT) to achieve the target correlated color temperature (CCT) by reducing the selected thickness when the correlated color temperature (CCT) is lower than the target correlated color temperature (CCT) and increasing the selected thickness when the correlated color temperature (CCT) is higher than the target correlated color temperature (CCT);

forming the wavelength conversion material into a wavelength conversion layer having a desired peripheral shape; and attaching the wavelength conversion layer to a light emitting diode (LED) die.

12. The method of claim 11 wherein the coating step is performed using a deposition apparatus configured to deposit the selected thickness of the wavelength conversion material on the transparent substrate and the controlling step controls a volumetric flow rate of the wavelength conversion material being deposited by the deposition apparatus.

13. The method of claim 11 wherein the coating step is performed using a deposition apparatus configured to deposit the selected thickness of the wavelength conversion material on the transparent substrate and the controlling step controls a speed by which the transparent substrate is moved past the deposition apparatus.

14. The method of claim 11 wherein the coating step is performed using a die coater controlled by a first actuator and a web containing the transparent substrate moved past the die coater by a second actuator.

15. The method of claim 11 wherein the evaluating step is performed using an electromagnetic energy source configured to direct electromagnetic radiation in a selected spectral region through the transparent substrate and through the wavelength conversion material on the transparent substrate into a detector.

16. The method of claim 11 further comprising prior to the attaching step separating the wavelength conversion material from the transparent substrate.

* * * * *